(12) United States Patent
Lee et al.

(10) Patent No.: US 11,127,928 B2
(45) Date of Patent: Sep. 21, 2021

(54) DISPLAY DEVICE

(71) Applicant: SAMSUNG DISPLAY CO., LTD., Yongin-si (KR)

(72) Inventors: Heeyoung Lee, Yongin-si (KR); Inseo Kee, Yongin-si (KR); Jinkyu Kim, Yongin-si (KR); Hansun Ryou, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 334 days.

(21) Appl. No.: 15/639,760

(22) Filed: Jun. 30, 2017

(65) Prior Publication Data
US 2018/0114950 A1 Apr. 26, 2018

(30) Foreign Application Priority Data
Oct. 24, 2016 (KR) .......................... 10-2016-0138641

(51) Int. Cl.
*H01L 51/52* (2006.01)
*H01L 51/00* (2006.01)
(Continued)

(52) U.S. Cl.
CPC ...... *H01L 51/5281* (2013.01); *H01L 51/0097* (2013.01); *H01L 51/5246* (2013.01); *H01L 51/5253* (2013.01); *G02B 5/3041* (2013.01); *G09F 9/301* (2013.01); *H01L 27/3244* (2013.01); *H01L 51/5293* (2013.01); *H01L 2251/5338* (2013.01)

(58) Field of Classification Search
CPC ............. H01L 51/0097; H01L 51/5246; H01L 51/5253; H01L 51/5281; H01L 27/32; H01L 27/3241; H01L 27/3244; H01L 51/52; H01L 51/524; H01L 51/5293; H01L 2251/5338
See application file for complete search history.

(56) References Cited

U.S. PATENT DOCUMENTS 9,823,397 B2 * 11/2017 Kunikata ............... G02B 5/305
10,101,511 B2 * 10/2018 Goto .................... G02B 5/3033
(Continued)

FOREIGN PATENT DOCUMENTS

EP       2993515 A1    3/2016
JP       2015-25904 A  2/2015
(Continued)

OTHER PUBLICATIONS

EPO Extended Search Report dated Mar. 26, 2018, for corresponding European Patent Application No. 17192152.1 (7 pages).

*Primary Examiner* — Andrew Q Tran
(74) *Attorney, Agent, or Firm* — Lewis Roca Rothgerber Christie LLP

(57) ABSTRACT

A display device includes: a display panel to display an image; an optical film over the display panel and including at least one phase retarder and a polarizer; a first adhesive layer between the display panel and the optical film and contacting a first surface of the optical film; and a second adhesive layer on the optical film and contacting a second surface of the optical film opposite the first surface, and the first adhesive layer and the second adhesive layer contact each other.

16 Claims, 9 Drawing Sheets

(51) Int. Cl.
  *G02B 5/30* (2006.01)
  *G09F 9/30* (2006.01)
  *H01L 27/32* (2006.01)

(56) References Cited

U.S. PATENT DOCUMENTS

2011/0007391 A1   1/2011   Takahashi
2012/0012828 A1   1/2012   Koh et al.
2013/0285938 A1   10/2013  Kang et al.
2014/0183473 A1   7/2014   Lee et al.
2015/0036074 A1   2/2015   Park et al.
2015/0183199 A1   7/2015   Kitagawa et al.
2016/0293895 A1   10/2016  Kim
2017/0278902 A1   9/2017   Choi et al.

FOREIGN PATENT DOCUMENTS

KR   10-2013-0000310       1/2013
KR   10-2013-0004198       1/2013
KR   10-2013-0120721       11/2013
KR   10-2015-0015243       2/2015
KR   10-2017-0113762 A     10/2017

* cited by examiner

DISPLAY DEVICE

CROSS-REFERENCE TO RELATED APPLICATION

This application claims priority to and the benefit of Korean Patent Application No. 10-2016-0138641, filed on Oct. 24, 2016 in the Korean Intellectual Property Office, the entire disclosure of which is incorporated herein by reference.

BACKGROUND

1. Field

Aspects of one or more embodiments relate to a display device.

2. Description of the Related Art

Generally, a display device includes a display unit over a substrate and displaying an image. At least a portion of the display device may be bent or folded, and thus the display device may be viewed at various angles and portability of the display device may be improved by reducing the volume of the display device.

Also, the display device may include an optical film which may prevent external light reflection. The optical film may improve visibility and contrast of an image by preventing light incident to the display device from being reflected by a metallic layer, etc. of the display device and being viewed by a user.

An optical film of a bendable or foldable display device of the related art, preventing external light reflection may receive tensile force or compressive force occurring while the display device is bent or folded. By this force, layers between layers of the optical film and/or adjacent to the optical film are floated, and moisture penetrates into the optical film via the floated region, and thus a polarizer of the optical film is denaturalized. That is, at least a portion of the optical film may not prevent external light reflection and thus quality of an image produced by the display device may deteriorate.

SUMMARY

According to an aspect of one or more embodiments, a display device has improved quality of a produced image by preventing or reducing penetration of moisture into an optical film. However, this aspect is provided as an example and the scope of the disclosure is not limited thereto.

Additional aspects will be set forth, in part, in the description which follows and, in part, will be apparent from the description, or may be learned by practice of the presented embodiments.

According to one or more embodiments, a display device includes: a display panel to display an image; an optical film over the display panel and including at least one phase retarder and a polarizer; a first adhesive layer between the display panel and the optical film and contacting a first surface of the optical film; and a second adhesive layer on the optical film and contacting a second surface of the optical film opposite the first surface, wherein the first adhesive layer and the second adhesive layer contact each other.

At least one of the first adhesive layer and the second adhesive layer may include a protrusion region protruding toward an outside of the optical film.

The protrusion region may surround a perimeter of the optical film.

The display panel may include a bending area bent around a bending axis extending in a direction, at least a portion of the optical film being in the bending area.

The protrusion region may include a first protrusion region and a second protrusion region spaced apart from each other in the direction in which the bending axis extends.

The first adhesive layer and the second adhesive layer may include a same material.

The display panel may include a display area and a non-display area, the display panel having an area greater than that of the optical film, and the optical film completely covering the display area.

The display device may further include: a window over the optical film; and a colored layer along an edge region of an inner surface of the window.

At least one of the first adhesive layer and the second adhesive layer may cover at least a portion of the colored layer.

The protrusion region of the at least one of the first adhesive layer and the second adhesive layer may have a thickness about three times to about fifty times greater than a thickness of the colored layer.

The second adhesive layer may include the protrusion region, the protrusion region covering an end of the optical film and an end of the first adhesive layer.

The first adhesive layer may have substantially a same area as that of the optical film.

The first adhesive layer may include the protrusion region, the protrusion region covering an end of the optical film and an end of the second adhesive layer.

The second adhesive layer may have substantially a same area as that of the optical film.

Each of the first adhesive layer and the second adhesive layer may include the protrusion region, the protrusion region of the first adhesive layer contacting the protrusion region of the second adhesive layer at an outer edge of the optical film.

The at least one phase retarder may include a ¼ wavelength phase retarder, and a pressure sensitive adhesive or an adhesive may be between the ¼ wavelength phase retarder and the polarizer.

The at least one phase retarder may include a ¼ wavelength phase retarder and a ½ wavelength phase retarder sequentially over the display panel, and a pressure sensitive adhesive or an adhesive may be between the ¼ wavelength phase retarder and the ½ wavelength phase retarder and between the ½ wavelength phase retarder and the polarizer.

The display panel may include: a flexible substrate; and an organic light-emitting device over the flexible substrate and including a pixel electrode, an intermediate layer, and an opposite electrode, the intermediate layer including an organic emission layer.

The display panel may further include: a protective film below the flexible substrate; and an encapsulation layer over the flexible substrate, covering the organic light-emitting device, and including at least one inorganic encapsulation layer and at least one organic encapsulation layer.

According to one or more embodiments, a display device includes: a display panel to display an image; an optical film over the display panel and including at least one phase retarder and a polarizer; a first adhesive layer between the display panel and the optical film and contacting a first surface of the optical film; and a second adhesive layer on the optical film and contacting a second surface of the optical film opposite the first surface, wherein at least one of the first adhesive layer and the second adhesive layer includes a protrusion region protruding toward an outside of the optical film, and the protrusion region covers an end of the optical film.

According to one or more embodiments, a display device includes: a display panel to display an image and including a bending area bent around a bending axis extending in a direction; an optical film over the display panel, including at least one phase retarder and a polarizer, and covering at least a portion of the bending area; a first adhesive layer between the display panel and the optical film and contacting a first surface of the optical film; and a second adhesive layer on the optical film and contacting a second surface facing the first surface of the optical film, wherein at least one of the first adhesive layer and the second adhesive layer includes a protrusion region protruding toward an outside of the optical film, and at least a portion of the protrusion region is over the bending area of the display panel.

According to an aspect of one or more embodiments, a display device prevents or reduces quality deterioration of a produced image due to moisture penetrating into an optical film and at least a portion of the optical film losing an external light reflection prevention function. However, the scope of the disclosure is not limited to this effect.

BRIEF DESCRIPTION OF THE DRAWINGS

These and/or other aspects will become apparent and more readily appreciated from the following description of some embodiments, taken in conjunction with the accompanying drawings in which.

DETAILED DESCRIPTION

Figure 1:
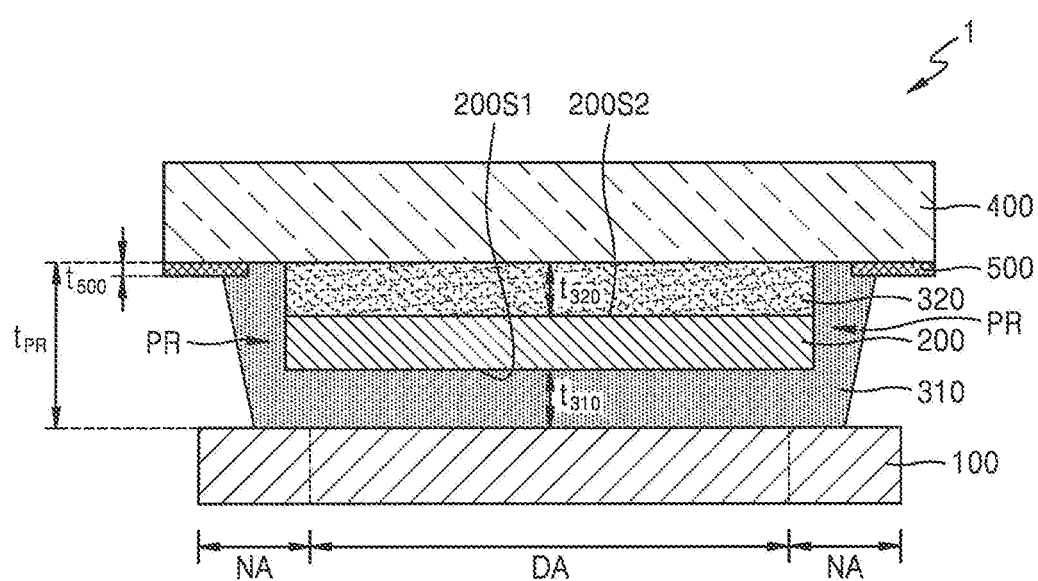
FIG. 1 is a schematic cross-sectional view of a display device according to an embodiment.

Although the disclosure allows for various changes and numerous embodiments, some exemplary embodiments will be illustrated in the drawings and described in further detail in the following description. Effects and characteristics of the disclosure, and a method of accomplishing these will be apparent when referring to some embodiments described with reference to the drawings. This disclosure may, however, be embodied in many different forms and should not be construed as limited to the exemplary embodiments set forth herein.

As used herein, the term "and/or" includes any and all combinations of one or more of the associated listed items.

Expressions such as "at least one of" when preceding a list of elements, modify the entire list of elements and do not modify the individual elements of the list.

Hereinafter, the disclosure will be described more fully with reference to the accompanying drawings, in which some exemplary embodiments of the disclosure are shown. When description is made with reference to the drawings, like reference numerals in the drawings denote like or corresponding elements, and repeated description thereof will be omitted.

It is to be understood that when a layer, region, or component is referred to as being "formed on" another layer, region, or component, it can be directly or indirectly formed on the other layer, region, or component. That is, for example, intervening layers, regions, or components may be present. Sizes of elements in the drawings may be exaggerated for convenience of explanation. In other words, since sizes and thicknesses of components in the drawings may be arbitrarily illustrated for convenience of explanation, embodiments are not limited thereto.

Hereinafter, some embodiments will be described with reference to the accompanying drawings.

Figure 2:
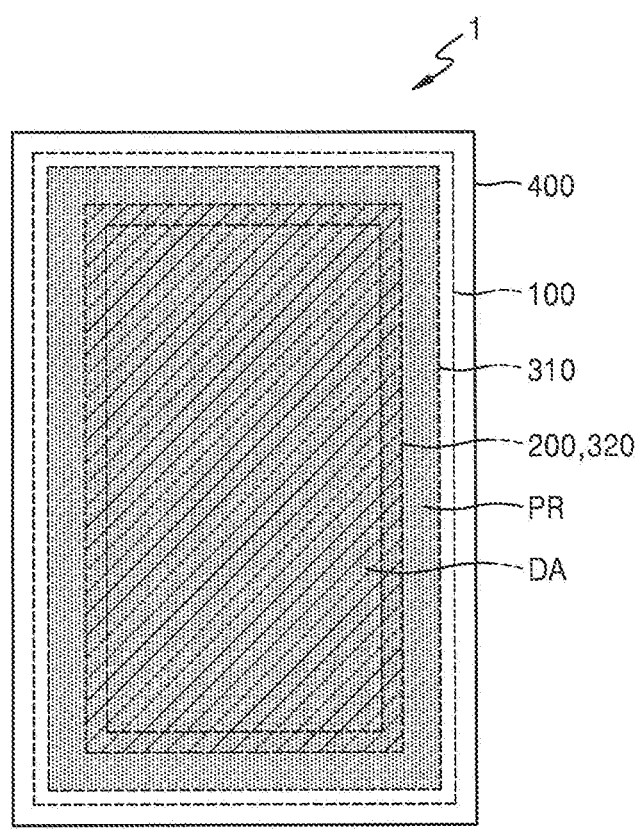
FIG. 2 is a schematic plan view of the display device of FIG. 1.
Figure 3:
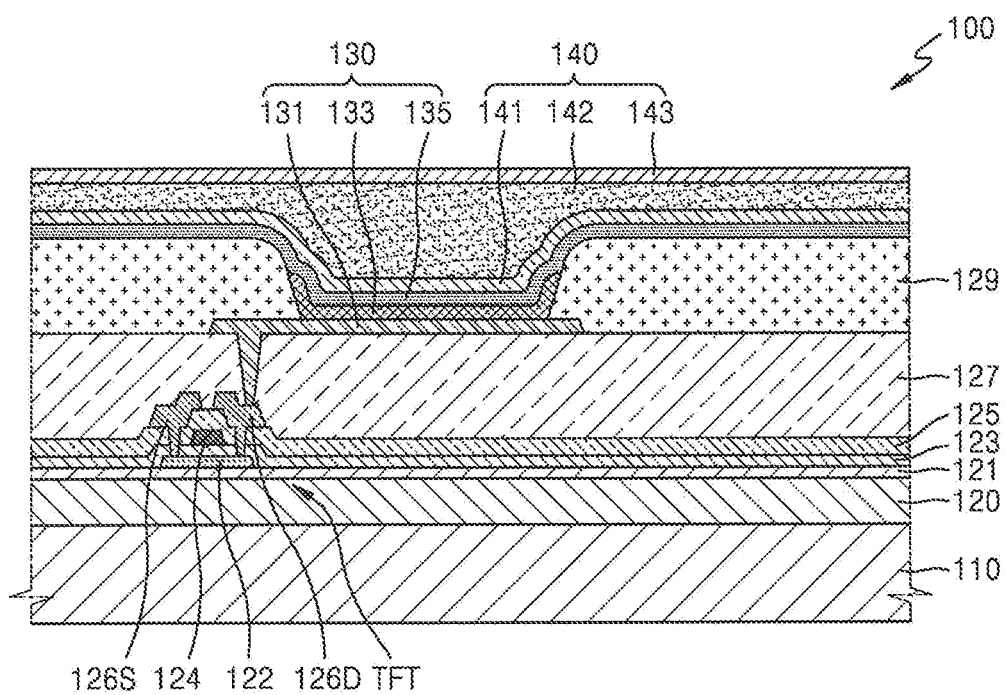
FIG. 3 is a schematic cross-sectional view of a portion of a display panel of the display device of FIG. 1.
Figure 4:
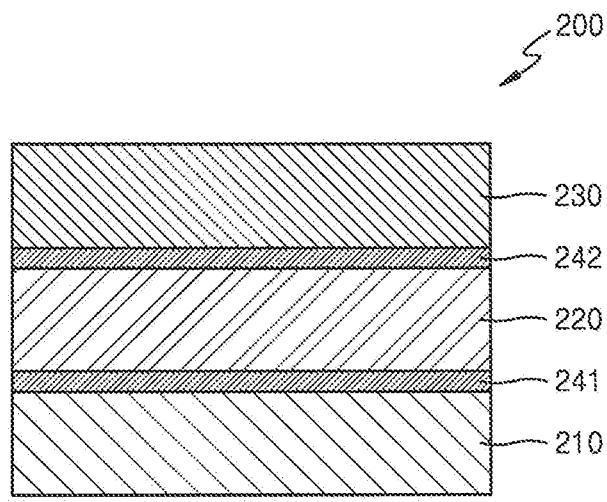
FIG. 4 is a schematic cross-sectional view of a configuration of an optical film of the display device of FIG. 1, according to an embodiment.

FIG. 1 is a schematic cross-sectional view of a display device according to an embodiment; FIG. 2 is a schematic plan view of the display device of FIG. 1; FIG. 3 is a schematic cross-sectional view of a portion of a display panel of the display device of FIG. 1; and FIG. 4 is a schematic cross-sectional view of a configuration of an optical film of the display device of FIG. 1, according to an embodiment.

Referring to FIGS. 1 to 4, a display device 1 according to an embodiment includes a display panel 100 displaying an image, an optical film 200 over the display panel 100 and including at least one phase retarder 210 and a polarizer 220, a first adhesive layer 310 between the display panel 100 and the optical film 200 and contacting a first surface 200S1 of the optical film 200, and a second adhesive layer 320 on the optical film 200 and contacting a second surface 200S2 of the optical film 200, the first adhesive layer 310 contacting the second adhesive layer 320.

With reference to FIG. 3, the display panel 100 may include a substrate 120 and an organic light-emitting device (OLED) 130 over the substrate 120. The substrate 120 may be a flexible substrate. For example, the substrate 120 may include a polymer resin, such as polyethersulfone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), or cellulose acetate propionate (CAP).

A thin film transistor (TFT) electrically connected to the OLED 130 may be over the substrate 120. The TFT may include a semiconductor layer 122 including amorphous silicon, polycrystalline silicon, or an organic semiconductor material, a gate electrode 124, a source electrode 126S, and a drain electrode 126D. To secure insulation between the semiconductor layer 122 and the gate electrode 124, a gate insulating layer 123 may be between the semiconductor layer 122 and the gate electrode 124, the gate insulating layer 123 including an inorganic material, such as silicon oxide, silicon nitride, and/or silicon oxynitride. An interlayer insulating layer 125 may be on the gate electrode 124, the interlayer insulating layer 125 including an inorganic material, such as silicon oxide, silicon nitride, and/or silicon oxynitride. The source electrode 126S and the drain electrode 126D may be on the interlayer insulating layer 125. The insulating layers including an inorganic material may be formed by chemical vapor deposition (CVD) or atomic layer deposition (ALD).

A buffer layer 121 may be between the substrate 120 and the TFT having the above structure, the buffer layer 121 including an inorganic material, such as silicon oxide, silicon nitride, and/or silicon oxynitride. The buffer layer 121 may increase planarization of the upper surface of the substrate 120, or prevent or minimize penetration of impurities from the substrate 120 into the semiconductor layer 122 of the TFT.

In an embodiment, a planarization layer 127 may be on the TFT. For example, in the case where the OLED 130 is over the TFT, the planarization layer 127 may substantially planarize the TFT. The planarization layer 127 may include an organic material, such as PI, benzocyclobutene (BCB), or hexamethyldisiloxane (HMDSO). Although the planarization layer 127 is shown as a single layer in FIG. 3, the planarization layer 127 may be a multi-layer and variously selected. The OLED 130 may be on the planarization layer 127, the OLED 130 including a pixel electrode 131, an opposite electrode 135, and an intermediate layer 133 between the pixel electrode 131 and the opposite electrode 135, the intermediate layer 133 including an emission layer. The pixel electrode 131 is electrically connected to the TFT by contacting one of the source electrode 126S and the drain electrode 126D via an opening of the planarization layer 127.

The pixel electrode 131 may be a reflective electrode including a reflective layer. For example, the reflective layer may include at least one of Ag, Mg, Al, Pt, Pd, Au, Ni, Nd, Ir, and Cr. A transparent or semi-transparent electrode layer may be further over the reflective layer, the transparent or semi-transparent electrode layer including at least one of indium tin oxide (ITO), indium zinc oxide (IZO), zinc oxide (ZnO), indium oxide ($In_2O_3$), indium gallium oxide (IGO), and aluminum zinc oxide (AZO).

In an embodiment, the pixel electrode 131 may include three layers including ITO/Ag/ITO.

A pixel-defining layer 129 may be on the planarization layer 127. The pixel-defining layer 129 defines a pixel by including an opening corresponding to each sub-pixel, that is, an opening exposing at least a central portion of the pixel electrode 131. The pixel-defining layer 129 may prevent an arc, etc. from occurring at an edge of the pixel electrode 131 by increasing a distance between the edge of the pixel electrode 131 and the opposite electrode 135 over the pixel electrode 131. The pixel-defining layer 129 may include an organic material, such as PI or HMDSO.

The intermediate layer 133 of the OLED 130 may include an organic emission layer. In addition, the intermediate layer 133 may further include at least one of a hole injection layer (HIL), a hole transport layer (HTL), an electron transport layer (ETL), and an electron injection layer (EIL). However, the embodiment is not limited thereto and the intermediate layer 133 may further include any of various functional layers.

The intermediate layer 133 is not limited to the above described layers and may have any of various structures. Also, the intermediate layer 133 may include a layer which is one body over a plurality of pixel electrodes 131 or include a layer patterned to respectively correspond to the pixel electrodes 131.

To emit white light, the organic emission layer may have a multi-layered structure in which a red emission layer, a green emission layer, and a blue emission layer are stacked, or may have a single-layered structure including a red emission material, a green emission material, and a blue emission material. The OLED 130 including the organic emission layer may emit full colors by additionally including a red color filter, a green color filter, and a blue color filter.

The opposite electrode 135 may be a (semi)-transparent electrode. For example, the opposite electrode 135 may include at least one of Ag, Al, Mg, Li, Ca, Cu, LiF/Ca, MgAg, and CaAg. The opposite electrode 135 may include a thin layer which may transmit light, the thin layer having a thickness in a range from about several nm to about tens of nm.

Since the OLED may be easily damaged by external moisture or oxygen, an encapsulation layer 140 may cover and protect the OLED. The encapsulation layer 140 may include a first inorganic encapsulation layer 141, an organic encapsulation layer 142, and a second inorganic encapsulation layer 143.

The first inorganic encapsulation layer 141 may cover the opposite electrode 135 and include silicon oxide, silicon nitride, and/or silicon oxynitride. When needed, one or more other layers, such as a capping layer or a LiF layer, may be between the first inorganic encapsulation layer 141 and the opposite electrode 135. Since the first inorganic encapsulation layer 141 is along a structure therebeneath, the upper surface of the first inorganic encapsulation layer 141 is not planarized, as illustrated in FIG. 3. The organic encapsulation layer 142 may cover the first inorganic encapsulation layer 141. Unlike the first inorganic encapsulation layer 141, the upper surface of the organic encapsulation layer 142 may be planarized. The organic encapsulation layer 142 may include at least one of PET, PEN, PC, PI, polyethylene sulfonate, polyoxymethylene, polyallylate, and HMDSO. The second inorganic encapsulation layer 143 may cover the organic encapsulation layer 142 and include silicon oxide, silicon nitride, and/or silicon oxynitride. The second inorganic encapsulation layer 143 may prevent the organic encapsulation layer 142 from being exposed to the outside by contacting the first inorganic encapsulation layer 141 in an edge region of the display panel 100.

As described above, the encapsulation layer 140 includes the first inorganic encapsulation layer 141, the organic encapsulation layer 142, and the second inorganic encapsulation layer 143. Through the above multi-layered structure, even when a crack occurs inside the encapsulation layer 140, the crack may not be connected between the first inorganic encapsulation layer 141 and the organic encapsulation layer 142 or between the organic encapsulation layer 142 and the second inorganic encapsulation layer 143. Through this structure, forming of a path via which external moisture or oxygen penetrates into the OLED 130 may be prevented or reduced.

In an embodiment, the display panel 100 includes a protective film 110 on a lower surface of the substrate 120, which is a surface in an opposite direction to a direction in which the OLED 130 is arranged. The protective film 110 may include PET or PI. The protective film 110 may be attached to the lower surface of the substrate 120 by using an adhesive layer (not shown).

For example, in a case of forming a plurality of display units over one parent substrate, to facilitate handling of the parent substrate having a flexible or bendable characteristic during a manufacturing process, a hard carrier substrate may be below the parent substrate. With the parent substrate supported by the carrier substrate, a circuit portion including a TFT, a plurality of OLEDs 130, and the encapsulation layer 140 encapsulating them are formed over the parent substrate. After the OLEDs 130 are formed over the parent substrate, the carrier substrate may be separated from the parent substrate. Also, after a touch electrode and/or a touch protective layer for protecting the touch electrode are formed, the carrier substrate may be separated from the parent substrate. In any case, a plurality of display panels 100 may be obtained by, after separating the carrier substrate from the parent substrate, attaching the protective film 110 on a surface of the parent substrate, and then cutting the parent substrate and the protective film. The substrate 120 may be understood as meaning the above-described cut parent substrate.

After the display panels 100 are obtained by cutting the parent substrate and the protective film 110, the optical film 200 may be attached to the encapsulation layer 140. If a touch electrode or a touch protective layer is over the encapsulation layer 140, the optical film 200 is over these elements.

Also, the display panels 100 may not be simultaneously obtained by using the parent substrate, and one display unit may be formed over one substrate 120. Even in this case, to facilitate handling of the substrate 120 having a flexible characteristic during a manufacturing process, a hard carrier substrate may be below the substrate 120. After a display element such as the OLED 130, a circuit portion including a TFT, and the encapsulation layer 140 encapsulating them are formed over the substrate 120, the carrier substrate may be separated from the substrate 120. Also, after a touch electrode and/or a touch protective layer for protecting the touch electrode are formed over the encapsulation layer 140, the carrier substrate may be separated from the substrate 120.

In any case, after the carrier substrate is separated from the parent substrate, the protective film 110 may be attached on a lower surface of the substrate 120. After that, the optical film 200 may be attached on the encapsulation layer 140 or the touch protective layer, and, if needed, a printed circuit substrate (not shown) or an electronic chip (not shown) may be attached to an edge region of the display panel 100.

Although FIG. 3 illustrates a case in which the display panel 100 has a flexible characteristic, embodiments are not limited thereto. For example, in another embodiment, the substrate 120 of the display panel 100 may not have a flexible characteristic and may be a rigid substrate including any of various materials, such as glass or metal. In an embodiment, the protective film 110 may be omitted.

The display panel 100 includes a display area DA displaying an image and a non-display area NA outside the display area DA and not displaying an image. A plurality of pixels is in the display area DA and may produce an image through a combination of light emitted respectively from the pixels. Wirings transferring signals to the pixels, and a circuit portion and a pad portion controlling electrical signals applied to the display area DA may be in the non-display area NA.

The optical film 200 is over the display panel 100. The optical film 200 may cover at least the display area DA of the display panel 100. As illustrated in FIG. 2, the display panel 100 may have an area that is greater than that of the optical film 200. For example, the optical film 200 may be manufactured less than the display panel 100 by taking into account an alignment tolerance while the optical film 200 is attached to the display panel 100. A distance between an end of the display panel 100 and an end of the optical film 200 may be from about 0.5 mm to about 2 mm.

The optical film 200 may improve visibility of the display device 1 by preventing or substantially preventing external light reflection. If the optical film 200 does not cover a portion of the display area DA, visibility of the display device 1 may deteriorate. Therefore, in an embodiment, the optical film 200 may completely cover the display area DA.

Referring to FIG. 4, the optical film 200 according to an embodiment may include the ¼ wavelength (λ/4) phase retarder 210 and the polarizer 220 sequentially over the display panel 100. The optical film 200 may further include a protective base member 230 supporting and protecting the polarizer 220. A pressure sensitive adhesive (PSA) or an adhesive 241 may be between the ¼ wavelength phase retarder 210 and the polarizer 220. For example, the PSA may be an acryl-based adhesive or a silicon-based adhesive. The adhesive may be a polyvinyl alcohol-based adhesive or an epoxy-based adhesive. The protective base member 230 may be a cyclo-olefin polymer (COP) film, a tri-acetyl cellulose (TAC) film, or an acrylic film. An adhesive 242 may be between the polarizer 220 and the protective base member 230. The adhesive 242 may be a water-based or ultraviolet (UV) adhesive. The PSA or adhesive 241 or 242 may be omitted depending on a method of forming the 114 wavelength phase retarder 210 and the polarizer 220.

The PSA and the adhesive are described further below. That is, the adhesive has adhesion and heat resistance greater than those of the PSA and may have a thickness that is less than that of the PSA. For example, since the adhesive has a thickness ranging from about 1 μm to about 5 μm and has a liquid state, the adhesive may be formed by applying moisture or irradiating light and hardening the liquid adhesive after a coating process. In contrast, the PSA has a thickness ranging from about 5 μm to about 500 μm, does not require a coating process, and may be simply formed by only a transfer process. Also, the adhesive cannot be detached after hardening, and when the adhesive is forcibly detached by applying external force, adhesion thereof disappears. On the other hand, the PSA is detachable.

According to an embodiment, the 114 wavelength phase retarder 210 may be a coated-type phase retarder. That is, the ¼ wavelength phase retarder 210 may include a reactive liquid crystal. The reactive liquid crystal may be a discotic liquid crystal or a nematic liquid crystal. In the case in which the display device has a flexible characteristic, the optical film 200 may have a minimized or reduced thickness to facilitate bending or folding. Therefore, the ¼ wavelength phase retarder 210 may include a coated-type phase retarder having a thickness less than that of a film-type phase retarder. Though not shown, in addition to the reactive liquid crystal, the ¼ wavelength phase retarder 210 may further include an alignment layer for aligning the reactive liquid crystals.

The polarizer 220 may be polyvinyl acetate (PVA) elongated in a direction (e.g., a predetermined direction) and may transmit only light polarized in a specific direction.

In an embodiment, an angle between a slow axis of the ¼ wavelength phase retarder 210 and an absorption axis of the polarizer 220 may be about 45°, and a combination of the ¼ wavelength phase retarder 210 and the polarizer 220 may prevent or substantially prevent external light reflection. Light incident to the optical film 200 from outside of the display device becomes polarized light by being polarized in a direction (e.g., a predetermined direction) while passing through the polarizer 220, and the polarized light may become circularly polarized light while passing through the ¼ wavelength phase retarder 210. The circularly polarized light may be reflected to the optical film 200 by the pixel electrode 131, the opposite electrode 135, or a metallic layer of the TFT of the display panel 100.

When light is reflected by a metallic layer, etc., circularly polarized light in a clockwise direction is converted into circularly polarized light in a counterclockwise direction, and circularly polarized light in a counterclockwise direction is converted into circularly polarized light in a clockwise direction. Light of which the rotation direction has been converted becomes light polarized in a direction (e.g., a predetermined direction) while passing through the ¼ wavelength phase retarder 210. However, a polarization direction of light which has passed through the ¼ wavelength phase retarder 210 after reflection is different, by about 90°, from a polarization direction of light incident to the ¼ wavelength phase retarder 210 before reflection. Therefore, incident external light is not emitted to an outside of the display device and thus is not visible to a user. By this, visibility and contrast of the display device 1 may be improved.

Although FIG. 4 illustrates an example in which the optical film 200 includes only one phase retarder, the embodiment is not limited thereto. That is, the phase retarder 210 may include a plurality of phase retarders so as to prevent or substantially prevent external light reflection in cooperation with the polarizer 220.

In a case in which moisture penetrates into the polarizer 220 of the optical film 200, a material forming the polarizer 220 may be deformed by the moisture and, thus, at least a portion of the polarizer 220 may lose a function as the polarizer. That is, the polarizer 220 loses a function of transmitting only light polarized in a specific direction and thus the deformed region of the polarizer 220 loses an external light reflection prevention function.

As illustrated in FIG. 1, the first adhesive layer 310 may be between the display panel 100 and the optical film 200, and the second adhesive layer 320 may be on the optical film 200. The first adhesive layer 310 and the second adhesive layer 320 may directly contact the first surface 200S1 and the second surface 200S2 opposite the first surface 200S1 of the optical film 200, respectively.

According to an embodiment, the optical film 200 is completely surrounded by the first adhesive layer 310 and the second adhesive layer 320. That is, the first adhesive layer 310 and the second adhesive layer 320 may seal the optical film 200 in addition to a function of coupling the optical film 200 to a layer under the first adhesive layer 310 and a layer on the second adhesive layer 320. Through this configuration, external foreign substances such as moisture cannot penetrate into the optical film 200 and, thus, a problem in which the optical film 200 loses the function of preventing external light reflection due to moisture may be reduced or prevented.

In an embodiment, the first adhesive layer 310 and the second adhesive layer 320 include a same material and may have a thickness in a range from about 10 μm to about 500 μm. That is, a thickness $t_{310}$ of the first adhesive layer 310 and a thickness $t_{320}$ of the second adhesive layer 320 may each be in a range from about 10 μm to about 500 μm. In an embodiment, the first adhesive layer 310 and the second adhesive layer 320 may include a PSA as defined above and do not include an adhesive. The adhesive requires coating and hardening processes. However, these processes are complicated or performing these processes on the display panel 100 and a window 400 may not be possible. Also, since the adhesive has a thickness in a range from about 1 μm to about 5 μm, it is difficult for the adhesive to cover an end of the optical film 200 and the adhesive cannot planarize a colored layer 500 on an inner surface of the window 400 having a thickness (e.g., a predetermined thickness) as described below.

According to an embodiment, the second adhesive layer 320 may have substantially a same area as that of the optical film 200. The first adhesive layer 310 may include a protrusion region PR covering an end of the optical film 200 and an end of the second adhesive layer 320. That is, the first adhesive layer 310 may contact the end of the second adhesive layer 320 and seal the optical film 200 in cooperation with the second adhesive layer 320.

The first adhesive layer 310 including the protrusion region PR may have an area that is greater than that of the optical film 200. The protrusion region PR may completely surround a perimeter of the optical film 200 including the end of the optical film 200. Through this configuration, moisture, etc. may not penetrate into the optical film 200. That is, the optical film 200 may be sealed by using the first adhesive layer 310 and the second adhesive layer 320 respectively under and on the optical film 200 without having to perform a separate process of sealing the optical film 200. However, embodiments are not limited thereto. According to another embodiment, the protrusion region PR may surround a portion of the optical film 200, as described below.

The window 400 may be on the second adhesive layer 320. The window 400 may include transparent glass or plastic and may protect the display panel 100, etc.

The colored layer 500 having a color (e.g., a predetermined color) may be on the inner surface of the window 400, that is, a surface of the window 400 facing in a direction in which the display panel 100 is arranged. The colored layer 500 may have a form of a frame around an edge region of the inner surface of the window 400. For example, the colored layer 500 may be a black matrix including a black or an organic material layer having a color (e.g., a predetermined color). In an embodiment, the colored layer 500 may include a printed letter or a design, for example.

According to an embodiment, the first adhesive layer 310 may cover at least a portion of the colored layer 500. That is, the first adhesive layer 310 may include the protrusion region PR protruding from a region arranged under the optical film 200, and the protrusion region PR may cover at least a portion of the colored layer 500. For example, a thickness $t_{500}$ of the colored layer 500 may be in a range from about 1.0 μm to about 50 μm. A thickness $t_{PR}$ of the protrusion region PR of the first adhesive layer 310 may be in a range from about 3 times to about 50 times greater than the thickness $t_{500}$ of the colored layer 500. When the thickness $t_{PR}$ of the protrusion region PR of the first adhesive layer 310 is less than the lower value of the above-described range, the optical film 200 may not be completely sealed by the first adhesive layer 310 due to a step difference by the colored layer 500. When the thickness $t_{PR}$ of the protrusion region PR of the first adhesive layer 310 is greater than the upper value of the above-described range, a total thickness of the display device 1 may increase excessively. Due to the excessive increase of the total thickness of the display device 1, in the case in which the display device 1 is implemented as a flexible display device 1, flexibility may be reduced.

As described above, since the optical film 200 is sealed by the first adhesive layer 310 and the second adhesive layer 320, moisture does not penetrate into the optical film 200 and a problem in which at least a portion of the polarizer 220 of the optical film 200 loses a function and cannot prevent external light reflection may be prevented or reduced. Therefore, quality of an image produced by the display device 1 may be improved.

Figure 5:
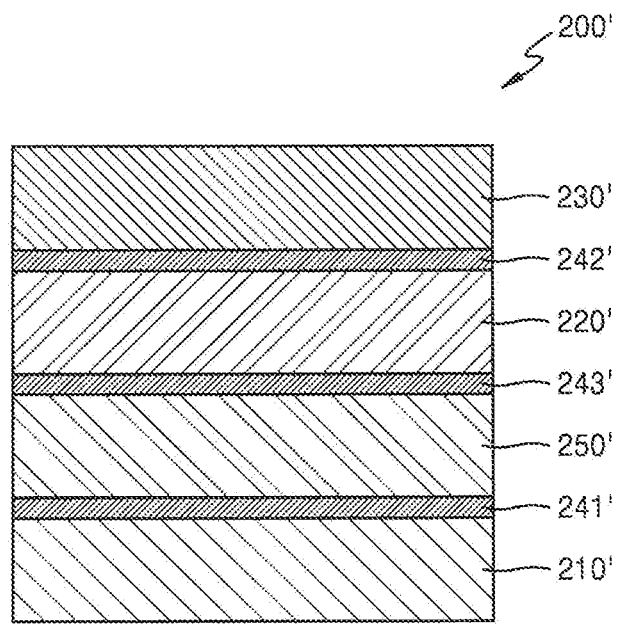
FIG. 5 is a schematic cross-sectional view of a configuration of an optical film of the display device of FIG. 1, according to another embodiment.

FIG. 5 is a schematic cross-sectional view of a configuration of an optical film of the display device of FIG. 1, according to another embodiment.

Referring to FIG. 5, an optical film 200' according to another embodiment may include a ¼ wavelength phase retarder 210', a ½ wavelength phase retarder 250', and a polarizer 220' sequentially arranged from the display panel 100 (see FIG. 1). That is, the optical film 200' of FIG. 5 may include two phase retarders 210' and 250'. The optical film 200' may further include a protective base member 230' supporting and protecting the polarizer 220'. A PSA or an adhesive 241' or 243' may be between the ¼ wavelength phase retarder 210' and the ½ wavelength phase retarder 250' and between the ½ wavelength phase retarder 250' and the polarizer 220'. For example, the PSA may be an acryl-based adhesive or a silicon-based adhesive. The adhesive may be a polyvinyl alcohol-based adhesive or an epoxy-based adhesive. The protective base member 230' may be a COP film, a TAC film, or an acrylic film. An adhesive 242' may be between the polarizer 220' and the protective base member 230'. The adhesive 242' may be a water-based or UV adhesive. The PSA or adhesive 241', 242', and 243' may be omitted depending on a method of forming the ¼ wavelength phase retarder 210', the ½ wavelength phase retarder 250', and the polarizer 220'.

According to an embodiment, the ¼ wavelength phase retarder 210' and the ½ wavelength phase retarder 250' may be coated-type phase retarders. That is, the ¼ wavelength phase retarder 210' may include a reactive liquid crystal. The reactive liquid crystal may be a discotic liquid crystal or a nematic liquid crystal. In the case in which the display device has a flexible characteristic, the optical film 200' may have a minimized or reduced thickness to facilitate bending or folding. Therefore, the ¼ wavelength phase retarder 210' and the ½ wavelength phase retarder 250' may include a coated-type phase retarder having a thickness that is less than that of a film-type phase retarder.

The polarizer 220' may be PVA elongated in a direction (e.g., a predetermined direction) and transmit only light polarized in a specific direction.

As illustrated in FIG. 4, in the case in which the optical film 200 includes only one ¼ wavelength phase retarder 210, an external light reflection prevention performance may deteriorate depending on a wavelength or an angle at which the display device 1 is viewed due to wavelength dependency of the ¼ wavelength phase retarder 210. Also, in the case in which the display device 1 is a bendable or foldable display device, since a direction of an optical axis of the ¼ wavelength phase retarder 210 is changed by tensile force occurring while the display device is bent or folded and an external light reflection prevention performance deteriorates, the color of an image produced by the display device 1 may differ from an intended color.

The optical film 200' of FIG. 5 includes at least two phase retarders 210' and 250' and the polarizer 220' and may include, for example, the ¼ wavelength phase retarder 210', the ½ wavelength phase retarder 250', and the polarizer 220' sequentially on the display panel 100. The ½ wavelength phase retarder 250' only changes a polarization direction of polarized light. An external light reflection prevention function may be performed by the same principle as that of the optical film 200 including only the ¼ wavelength phase retarder 210 and the polarizer 220 illustrated in FIG. 4, and a problem in which the external light reflection prevention performance changes depending on a wavelength and an angle at which the display device is viewed, may be minimized or reduced by properly setting an angle between an absorption axis of the polarizer 220' and optical axes of the ¼ wavelength phase retarder 210' and the ½ wavelength phase retarder 250'.

Figure 6:
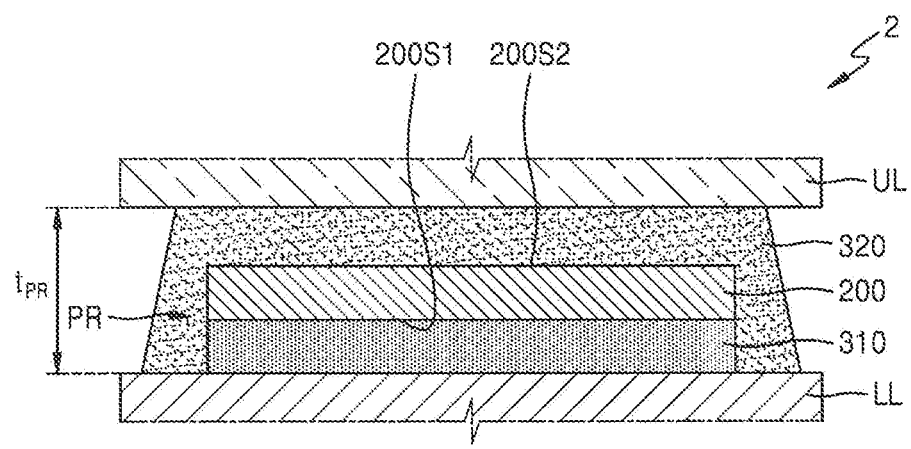
FIG. 6 is a schematic cross-sectional view of a portion of a display device according to another embodiment.

FIG. 6 is a schematic cross-sectional view of a portion of a display device according to another embodiment. Herein, differences between the display device of FIG. 6 and the display device 1 of FIG. 1 are mainly described.

Referring to FIG. 6, a display device 2 according to another embodiment includes the display panel 100 (see FIG. 1) displaying an image, the optical film 200 over the display panel 100, the first adhesive layer 310 between the display panel 100 and the optical film 200 and contacting the first surface 200S1 of the optical film 200, and the second adhesive layer 320 on the optical film 200 and contacting the second surface 200S2 of the optical film 200. The first adhesive layer 310 may contact the second adhesive layer 320.

Besides the display panel 100, various layers such as a touch layer (not shown) between the display panel 100 and the first adhesive layer 310 may be below the first adhesive layer 310. In FIG. 6, layers below the first adhesive layer 310 and contacting the first adhesive layer 310 are referred to as lower layers LL. Likewise, besides the window 400 (see FIG. 1), various layers such as a touch layer (not shown) between the second adhesive layer 320 and the window 400 may be over the second adhesive layer 320. Layers over the second adhesive layer 320 and contacting the second adhesive layer 320 are referred to as upper layers UL. That is, the lower layers LL and the upper layers UL may be any layers performing various functions as well as an uppermost layer and the window 400 of the display panel 100. In an embodiment, the window 400 may be a glass window or a film window including plastic.

Figure 9:
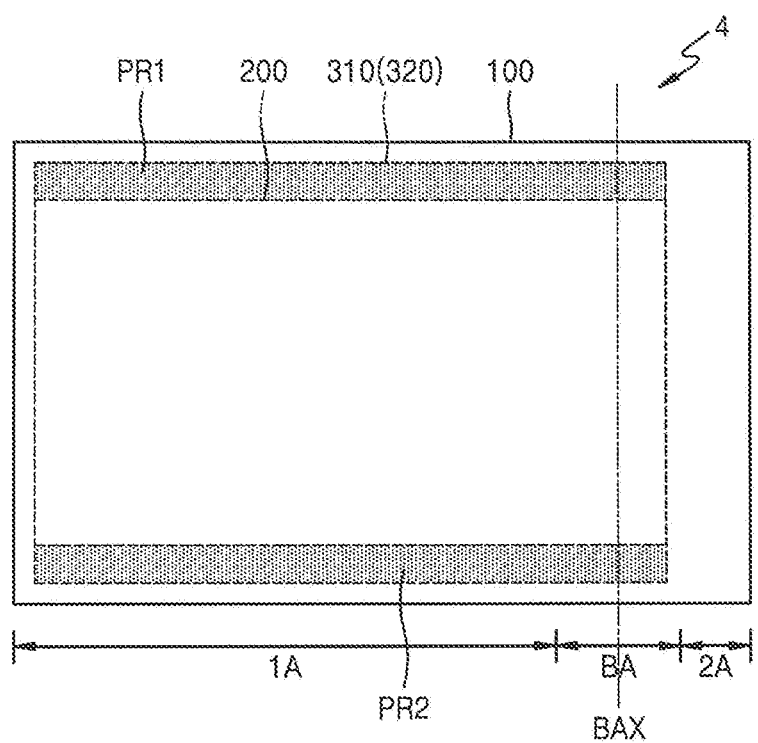
FIG. 9 is a schematic plan view of the display device of FIG. 8.
Figure 11:
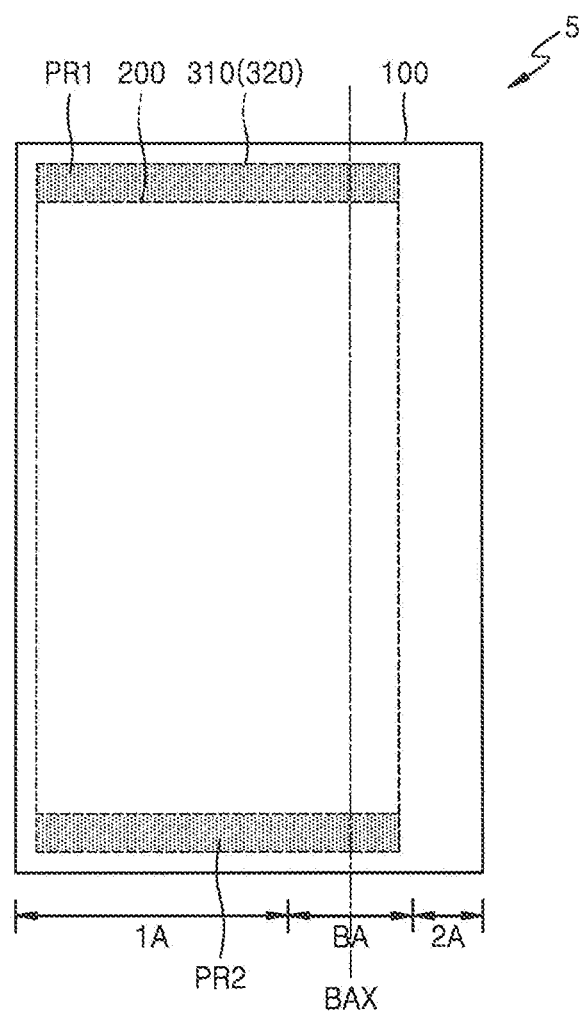
FIG. 11 is a schematic plan view of the display device of FIG. 10.

According to an embodiment, the first adhesive layer 310 may have substantially a same area as that of the optical film 200. The second adhesive layer 320 may include the protrusion region PR covering an end of the optical film 200 and an end of the first adhesive layer 310. That is, the second adhesive layer 320 may contact an end of the first adhesive layer 310 and seal at least a portion of the optical film 200 in cooperation with the first adhesive layer 310. The protrusion region PR of the second adhesive layer 320 may completely surround a perimeter of the optical film 200, as illustrated in FIG. 2, or may surround only a portion of a perimeter of the optical film 200, as illustrated in FIGS. 9 and 11, for example. Through this configuration, a problem in which moisture penetrates into the optical film 200, and thus an external light reflection prevention function of the optical film 200 is lost, may be reduced or prevented.

The protrusion region PR of the second adhesive layer 320 may extend from the second adhesive layer 320 on the second surface 200S2 of the optical film 200 and contact the lower layers LL under the first adhesive layer 310.

Thicknesses of the first adhesive layer 310 and the second adhesive layer 320 may have a value in a range from about 10 μm to about 500 μm. In a case in which the lower layers LL and the upper layers UL include a step difference, the first adhesive layer 310 and the second adhesive layer 320 may have a thickness about 3 times to about 50 times greater than a height corresponding to a maximum step difference. For example, the upper layers UL may be the window 400 (see FIG. 1) and the colored layer 500 (see FIG. 1) on the inner surface of the window 400. The protrusion region PR of the second adhesive layer 320 may have a thickness $t_{PR}$ that is about 3 times to about 50 times greater than the thickness t00 (see FIG. 1) of the colored layer 500.

Figure 7:
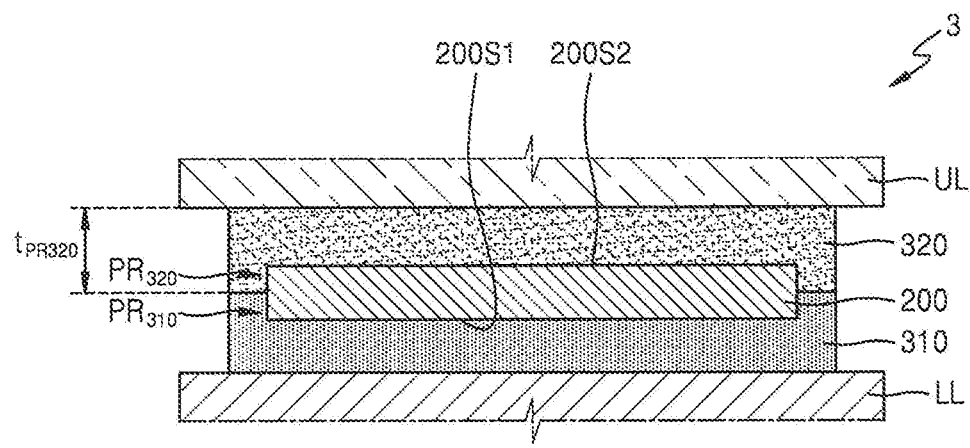
FIG. 7 is a schematic cross-sectional view of a portion of a display device according to another embodiment.

FIG. 7 is a schematic cross-sectional view of a portion of a display device according to another embodiment. Herein, differences between the display device of FIG. 7 and the display device 1 of FIG. 1 are mainly described.

Referring to FIG. 7, a display device 3 according to another embodiment includes the display panel 100 (see FIG. 1) displaying an image, the optical film 200 over the display panel 100, the first adhesive layer 310 between the display panel 100 and the optical film 200 and contacting the first surface 200S1 of the optical film 200, and the second adhesive layer 320 on the optical film 200 and contacting the second surface 200S2 of the optical film 200. The first adhesive layer 310 may contact the second adhesive layer 320.

A lower layer LL may be under the first adhesive layer 310. For example, the lower layer LL may be an uppermost layer of the display panel 100 or a touch layer (not shown). An upper layer UL may be on the second adhesive layer 320. For example, the upper layer UL may be the window 400 (see FIG. 1) or a touch layer (not shown). That is, the touch layer (not shown) may be on or under the optical film 200.

According to an embodiment, the first adhesive layer 310 and the second adhesive layer 320 may respectively include protrusion regions $PR_{310}$ and $PR_{320}$. The protrusion region $PR_{310}$ of the first adhesive layer 310 may contact the protrusion region $PR_{320}$ of the second adhesive layer 320 at an outer edge of the optical film 200.

That is, the protrusion region $PR_{310}$ of the first adhesive layer 310 and the protrusion region $PR_{320}$ of the second adhesive layer 320 may each contact at least a portion of the optical film 200 and seal at least a portion of the optical film 200. The protrusion region $PR_{310}$ of the first adhesive layer 310 and the protrusion region $PR_{320}$ of the second adhesive layer 320 may completely surround a perimeter of the optical film 200, as illustrated in FIG. 2, or may surround a portion of a perimeter of the optical film 200, as illustrated in FIGS. 9 and 11, for example. Through this configuration, a problem in which moisture penetrates into the optical film 200, and thus an external light reflection prevention function of the optical film 200 is lost, may be reduced or prevented.

Thicknesses of the first adhesive layer 310 and the second adhesive layer 320 may have a value in a range from about 10 μm to about 500 μm. In a case in which the lower layer LL and the upper layer UL include a step difference, the first adhesive layer 310 and the second adhesive layer 320 may have a thickness about 3 times to about 50 times greater than a height corresponding to a maximum step difference. For example, the upper layer UL may include the window 400 (see FIG. 1) and the colored layer 500 (see FIG. 1) on the inner surface of the window 400. The protrusion region $PR_{320}$ of the second adhesive layer 320 may have a thickness $t_{PR320}$ that is about 3 times to about 50 times greater than the thickness $t_{500}$ (see FIG. 1) of the colored layer 500.

Figure 8:
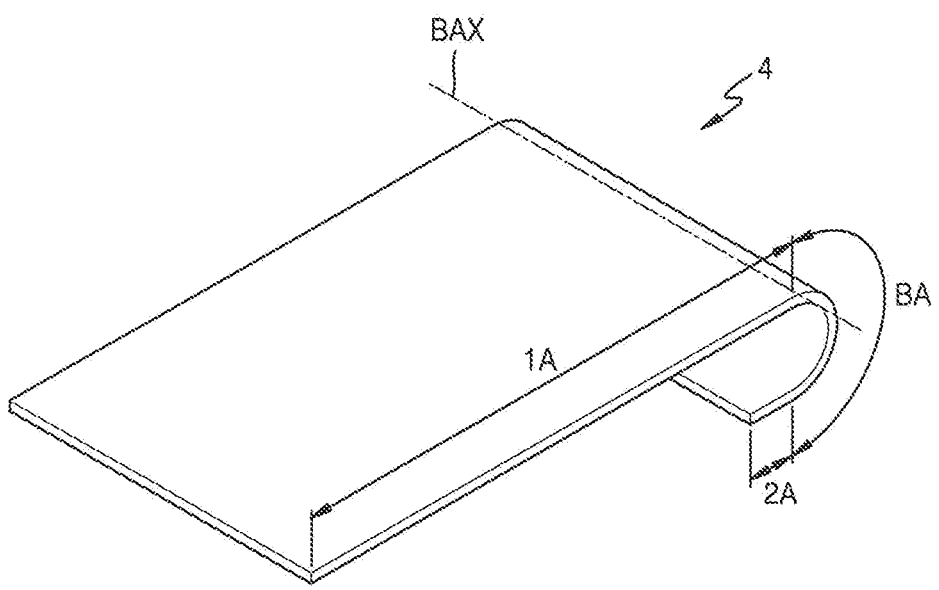
FIG. 8 is a schematic perspective view of a display device according to another embodiment.

FIG. 8 is a schematic perspective view of a display device according to another embodiment; and FIG. 9 is a schematic plan view of the display device of FIG. 8.

Referring to FIGS. 8 and 9, a display device 4 according to another embodiment includes the display panel 100 displaying an image, the optical film 200 over the display panel 100, the first adhesive layer 310 between the display panel 100 and the optical film 200, and the second adhesive layer 320 on the optical film 200. The first adhesive layer 310 may contact the second adhesive layer 320.

The display panel 100 includes a first area 1A, a second area 2A, and a bending area BA between the first area 1A and the second area 2A, the bending area being bent or bendable around a bending axis BAX. For example, the display panel 100 may include various kinds of display elements over a flexible substrate. In an embodiment, the first area 1A includes a display area displaying an image. In addition to the display area, the first area 1A may include a portion of a non-display area outside the display area. The display area may extend to the bending area BA if desired. Here, the bending axis BAX may be defined as an axis corresponding to a central axis of the bending area BA of the display panel 100.

The optical film 200 may be over at least a portion of the bending area BA. The display device 4 may be formed by forming the optical film 200 with the display panel 100 not bent and then bending the display panel 100 and the optical film 200. However, while the optical film 200 is bent, a space between layers of the optical film 200 and/or a layer adjacent to the optical film 200 may be formed, and moisture may penetrate into the optical film 200 via a gap generated by the formed space. A characteristic of the polarizer 220 (see FIG. 4) of the optical film 200 may change due to the penetrated moisture and thus at least a portion of the optical film 200 may lose an external light reflection prevention function.

However, according to an embodiment, penetration of moisture, etc. into the optical film 200 may be prevented or substantially prevented by sealing the optical film 200 with the first adhesive layer 310 and the second adhesive layer 320 respectively contacting both surfaces of the optical film 200. As described above, since moisture may otherwise easily penetrate into the optical film 200 while the optical film 200 is bent, a portion of the optical film 200 corresponding to an area of the optical film 200 where a space between layers may be formed while the optical film 200 is bent is sealed.

As illustrated in FIG. 9, at least one of the first adhesive layer 310 and the second adhesive layer 320 may include protrusion regions PR1 and PR2 covering ends of the optical film 200. The protrusion regions PR1 and PR2 may include the first protrusion region PR1 and the second protrusion region PR2 spaced apart from each other in a direction in which the bending axis BAX extends.

In an embodiment, protrusion regions may not be in both edge regions along both directions from the bending axis BAX of the display panel 100, but protrusion regions may be respectively in both other edge regions at least partially included in the bending area BA. That is, since a portion of the optical film 200 in the edge regions not including the bending area BA of the display panel 100 is not bent, moisture may not penetrate into the optical film 200 through this portion. However, since a portion of the optical film 200 in the edge regions including the bending area BA is bent concurrently or simultaneously with the display panel 100, moisture may otherwise easily penetrate into the optical film 200 through this portion. Therefore, at least one of the first adhesive layer 310 and the second adhesive layer 320 in the portion into which moisture otherwise could easily penetrate includes the protrusion regions PR1 and PR2. That is, the first adhesive layer 310 may contact the second adhesive layer 320 in a portion corresponding to the opposite edges that are spaced apart in the direction in which the bending axis BAX extends.

Through this configuration, penetration of moisture into the optical film 200 may be prevented or reduced.

Figure 10:
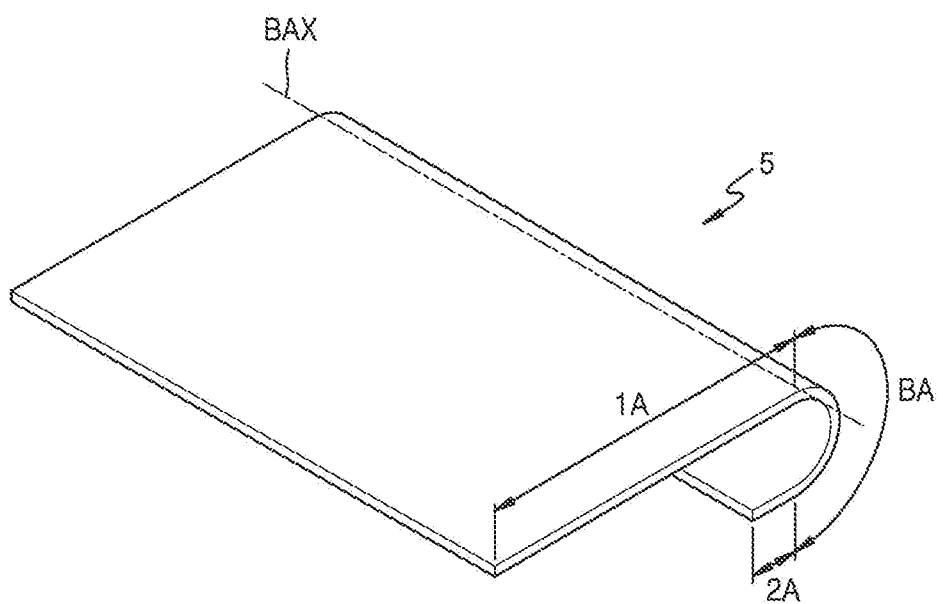
FIG. 10 is a schematic perspective view of a display device according to another embodiment.

FIG. 10 is a schematic perspective view of a display device according to another embodiment; and FIG. 11 is a schematic plan view of the display device of FIG. 10.

Referring to FIGS. 10 and 11, a display device 5 according to another embodiment is the same as the display device 4 of FIGS. 8 and 9, except that a short side and a long side of the display panel 100 are changed.

That is, in the display device 4 of FIGS. 8 and 9, the first protrusion region PR1 and the second protrusion region PR2 may correspond to both edge regions corresponding to the long side of the display panel 100. In contrast, in the display device 5 of FIGS. 10 and 11, the first protrusion region PR1 and the second protrusion region PR2 may correspond to both edge regions corresponding to the short side of the display panel 100.

That is, the display panel 100 of the display device 5 includes the first area 1A, the second area 2A, and the bending area BA between the first area 1A and the second area 2A, the bending area BA being bent or bendable around the bending axis BAX. The bending axis BAX may extend in a direction substantially parallel to the long side of the display panel 100. Therefore, penetration of moisture into the optical film 200 may be prevented or reduced by respectively arranging the protrusion regions PR1 and PR2 included in at least one of the first adhesive layer 310 and the second adhesive layer 320 in two edge regions including the bending area BA, and allowing the first adhesive layer 310 to contact the second adhesive layer 320.

The first protrusion region PR1 and the second protrusion region PR2 may be the protrusion region from the first adhesive layer 310 as illustrated in FIG. 1, the protrusion region from the second adhesive layer 320 as illustrated in FIG. 6, or the protrusion regions respectively from the first adhesive layer 310 and the second adhesive layer 320 as illustrated in FIG. 7.

Though not shown, a display device according to an embodiment may include at least two bending areas. That is, the display panel may have a form including a plurality of regions that are bent. In this case, the edge region corresponding to the bending area of the optical film may be sealed by allowing the first adhesive layer to contact the second adhesive layer.

The display devices 1, 2, 3, 4, and 5 according to the described embodiments may prevent or reduce a problem in which moisture penetrates into the optical film 200, at least a portion of the optical film 200 loses an external light reflection prevention function, and in which quality of a produced image is deteriorated.

Although the disclosure has been described with reference to the embodiments illustrated in the drawings, these are merely provided as an example and it is to be understood by those of ordinary skill in the art that various changes in form and details and equivalents thereof may be made therein without departing from the spirit and scope of the disclosure as defined by the following claims.

What is claimed is:

1. A display device comprising:
   a display panel displaying an image;
   an optical film disposed over the display panel and comprising a polarizer and at least one phase retarder;
   a first adhesive layer disposed between the display panel and the optical film and contacting a first surface of the optical film; and
   a second adhesive layer disposed on the optical film and contacting a second surface of the optical film opposite the first surface,
   wherein each of the first adhesive layer and the second adhesive layer comprises a pressure sensitive adhesive, and at least one of the first adhesive layer and the second adhesive layer extends outside of a perimeter of the optical film such that the first adhesive layer and the second adhesive layer contact each other.

2. The display device of claim 1, wherein at least one of the first adhesive layer and the second adhesive layer comprises a protrusion region protruding toward the outside of the optical film.

3. The display device of claim 2, wherein the protrusion region surrounds the perimeter of the optical film.

4. The display device of claim 2, wherein the display panel comprises a bending area bent around a bending axis extending in a direction, at least a portion of the optical film being in the bending area.

5. The display device of claim 4, wherein the protrusion region comprises a first protrusion region and a second protrusion region spaced apart from each other in the direction in which the bending axis extends.

6. The display device of claim 2, further comprising:
   a window disposed over the optical film; and
   a colored layer along an edge region of an inner surface of the window.

7. The display device of claim 6, wherein at least one of the first adhesive layer and the second adhesive layer covers at least a portion of the colored layer.

8. The display device of claim 7, wherein the protrusion region of the at least one of the first adhesive layer and the second adhesive layer has a thickness about three times to about fifty times greater than a thickness of the colored layer.

9. The display device of claim 2, wherein the second adhesive layer comprises the protrusion region, the protrusion region covering an end of the optical film and an end of the first adhesive layer.

10. The display device of claim 9, wherein the first adhesive layer has substantially a same area as that of the optical film.

11. The display device of claim 2, wherein the first adhesive layer comprises the protrusion region, the protrusion region covering an end of the optical film and an end of the second adhesive layer.

12. The display device of claim 11, wherein the second adhesive layer has substantially a same area as that of the optical film.

13. The display device of claim 2, wherein each of the first adhesive layer and the second adhesive layer comprises the protrusion region, the protrusion region of the first adhesive layer contacting the protrusion region of the second adhesive layer at an outer edge of the optical film.

14. The display device of claim 1, wherein the first adhesive layer and the second adhesive layer comprise a same material.

15. The display device of claim 1, wherein the display panel comprises a display area and a non-display area, the display panel having an area greater than that of the optical film, and the optical film completely covers the display area.

16. The display device of claim 1, wherein the pressure sensitive adhesive of each of the first adhesive layer and the second adhesive layer comprises an acryl-based adhesive or a silicon-based adhesive, and has a thickness of about 10 μm to about 500 μm.

* * * * *